US006344779B1

(12) United States Patent
Haruta et al.

(10) Patent No.: US 6,344,779 B1
(45) Date of Patent: Feb. 5, 2002

(54) OSCILLATOR AND RADIO EQUIPMENT

(75) Inventors: Kazumasa Haruta, Nagaokakyo; Sadao Yamashita, Kyoto; Toru Tanizaki, Nagaokakyo; Koichi Sakamoto, Otsu, all of (JP)

(73) Assignee: Muarata Manufacturing Co., Ltd. (JP)

( * ) Notice: Subject to any disclaimer, the term of this patent is extended or adjusted under 35 U.S.C. 154(b) by 0 days.

(21) Appl. No.: 09/680,905

(22) Filed: Oct. 6, 2000

(30) Foreign Application Priority Data

Oct. 7, 1999 (JP) ............................ 11-286652

(51) Int. Cl.[7] ............................ H03B 7/14; H03B 1/00; H03L 7/099
(52) U.S. Cl. ........................ 331/96; 331/36 C; 331/68; 331/107 SL; 331/107 DP; 331/177 V
(58) Field of Search ................................. 331/36 C, 68, 331/96, 99–102, 117 R, 117 D, 117 FE, 107 DP, 107 SL, 107 G, 107 T, 177 V

(56) References Cited

U.S. PATENT DOCUMENTS 3,866,144 A * 2/1975 Sawayama et al. ..... 331/107 G

* cited by examiner

*Primary Examiner*—David Mis
(74) *Attorney, Agent, or Firm*—Ostrolenk, Faber, Gerb & Soffen, LLP

(57) ABSTRACT

An oscillation circuit is constructed by providing a line, a Gunn diode, and a dielectric resonator on a dielectric substrate; by disposing a dielectric stripline between upper and lower conductor plates to form an NRD guide which serves as a output transmission line; and the line and the NRD guide are coupled.

10 Claims, 6 Drawing Sheets

OSCILLATOR AND RADIO EQUIPMENT

BACKGROUND OF THE INVENTION

1. Field of the Invention

The present invention relates to an oscillator for the microwave band or the milliwave band provided with an oscillation circuit using a Gunn diode, etc., and an output transmission line to output an oscillation signal. The invention further relates to radio equipment using the oscillator.

2. Description of the Related Art

Up to now, oscillators for the microwave band and the milliwave band using a negative-resistance element such as a Gunn diode, etc., have used a dielectric resonator as an output transmission line, as shown in (1) Japanese Unexamined Patent Application Publication No. 6-268445 and (2) Japanese Unexamined Patent Application Publication No. 9-205324.

In this way, when the dielectric line is utilized as an output transmission line, an oscillator of high performance can be constructed by making the best use of the resonator's low loss characteristics.

However, in the conventional oscillator shown in the above-mentioned Japanese Unexamined Patent Application Publication No. 6-268445, because a stripline and a dielectric line are coupled by a three-dimensional arrangement, the degree of coupling and other factors are varied by the length of the stripline and the location of its open ends. Therefore, it is difficult to achieve coupling between the dielectric line (hereinafter, called an "NRD guide") and the dielectric resonator at locations to obtain the most appropriate phase relationship. Moreover, in the coupling portion between the stripline and the NRD guide, another problem is that because the symmetry to the left and the right collapses, unwanted modes of electromagnetic field are easily generated.

Furthermore, in the conventional oscillators shown in both Japanese Unexamined Patent Application Publication No. 6-268445 and Japanese Unexamined Patent Application Publication No. 9-205324, it is necessary to dispose the dielectric resonator in a space between upper and lower conductor plates, that is, a cutoff area of an NRD guide, and accordingly it is difficult with these devices to obtain an oscillator of smaller size.

SUMMARY OF THE INVENTION

Accordingly, the present invention provides an oscillator in which the above-mentioned problems are solved. With this oscillator, it is easy to design and adjust the coupling portion between a stripline and an NRD guide, unwanted modes are suppressed, and the size is reduced. The invention also provides radio equipment using the oscillator.

In an embodiment of an oscillator of the present invention which is provided with an oscillation circuit constructed on a dielectric substrate and an output transmission line which transmits an oscillation output signal from the oscillation circuit, a line made up of a conductor pattern is constructed on the dielectric substrate, a negative-resistance element is connected to the line, a dielectric resonator is disposed in the vicinity of the line on the dielectric substrate, this dielectric resonator is coupled to the line, and between the connecting location of the negative-resistance element and the coupling location of the dielectric resonator in the line, the line is coupled to the output transmission line.

In another aspect of an oscillator of the present invention, the output transmission line is made up of a dielectric line in which a dielectric stripline is disposed between two nearly parallel conductor plates.

In another aspect of an oscillator of the present invention, when the wavelength on the line is denoted by $\lambda_g$, the length from the connecting location of the negative-resistance element to an end portion in the vicinity of the line is made $\lambda_g/4 + N_1 \times \lambda_g/2$ (wherein $N_1$ is an integer greater than zero), the length from the connecting location of the negative-resistance element to the coupling location of the output transmission line is made $N_2 \times \lambda_g/2$ (wherein $N_2$ is an integer greater than zero), and the length from the coupling location of the output transmission line to the coupling location of the dielectric resonator is made $N_3 \times \lambda_g/2$ (wherein $N_3$ is an integer greater than zero).

In another aspect of an oscillator of the present invention, the dielectric resonator is constructed by providing electrodes having an opening portion on another dielectric substrate with which the dielectric substrate is laminated.

In another aspect of an oscillator of the present invention, a secondary line to be coupled to the dielectric resonator is provided on the dielectric substrate, a variable reactance element is connected to the secondary line, and a line is provided for supplying control voltage to the variable reactance element.

In another aspect of an oscillator of the present invention, the output transmission line is made up of a transmission line in which a portion of dielectric material is contained between two nearly parallel conductor surfaces and which has cutoff characteristics, and the cutoff frequency of the transmission line is determined so as to cut off the fundamental wave component, or the fundamental wave component and lower-order harmonics, and so that the harmonic components of higher order than the cut-off components are transmitted.

In another aspect of an oscillator of the present invention, a terminal which is weakly coupled to the oscillation circuit is provided.

In another aspect of an oscillator of the present invention, the output line is made up of a dielectric line in which a dielectric stripline is disposed between nearly parallel conductor plates, and by forming a slot in one conductor plate and by disposing the dielectric substrate outside the conductor plate, a line of the oscillation circuit and the dielectric line are coupled.

In another aspect of an oscillator of the present invention, the dielectric substrate is housed inside a case, a portion of wide line width and a portion of narrow line width are provided in the bias line, and in the vicinity of a portion of narrow line width a spring for fixing the dielectric plate on the inside surface of the case is provided.

Radio equipment embodying the present invention can be constructed by using any one of the above oscillators.

Other features and advantages of the present invention will become apparent from the following description of the invention which refers to the accompanying drawings, in which like references denote like elements and parts.

DESCRIPTION OF EMBODIMENTS OF THE INVENTION

The construction of an oscillator according to a first embodiment is described with reference to FIGS. 1A, 1B, 1C, 2, and 3.

Figure 1A:
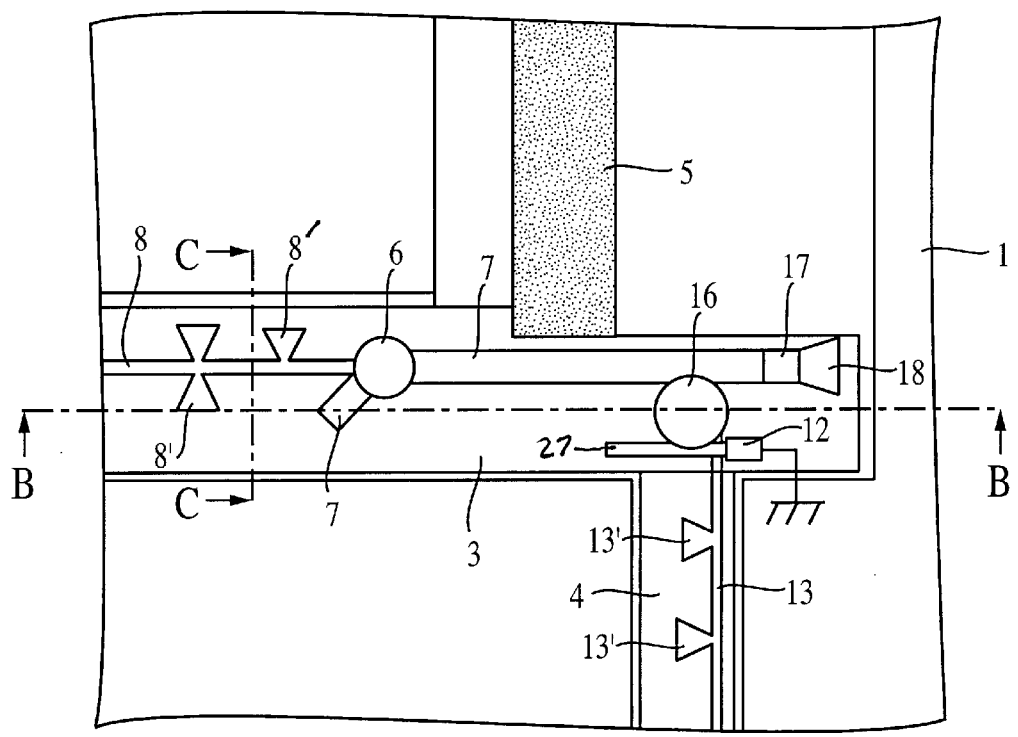
FIGS. 1A, 1B, and 1C show the construction of an oscillator according to a first embodiment.
Figure 1B:
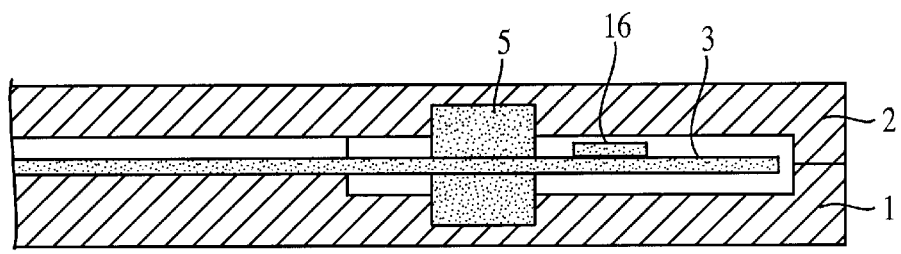
Figure 1C:
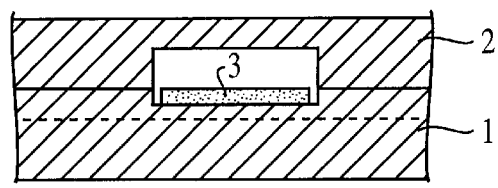

FIG. 1A is a top view of an oscillator having upper and lower conductor plates in which the upper conductor plate is removed, FIG. 1B is a sectional view taken on line B—B in FIG. 1A, and FIG. 1C is a sectional view taken on line C—C in FIG. 1A. In FIGS. 1A to 1C, a lower conductor plate 1 and an upper conductor plate 2 are shown, and inside a space sandwiched between these upper and lower conductor plates an oscillator is constructed. In the drawings, dielectric substrates 3 and 4 are shown. A line 7 for an oscillation circuit is provided on the upper surface of the dielectric substrate 3, and a Gunn diode 6 is connected at a fixed location in the line 7. The Gunn diode 6 is of a pill package type and is mounted on the lower conductor plate 1, and an electrode which projects from the Gunn diode 6 passes through a hole formed in the dielectric substrate 3 and is electrically connected to the line 7 by soldering, etc.

On the upper surface of the dielectric substrate 3, a bias line 8 for supplying a bias voltage to the above Gunn diode 6 is formed, and stubs 8' are provided at fixed locations along the bias line 8.

Furthermore, on the upper surface of the dielectric substrate 3, a variable reactance element 12 is mounted between a secondary line 27 and ground. Moreover, on the upper surface of this dielectric substrate 3, a dielectric resonator 16 is mounted so that part of the resonator comes over the line 7 and the secondary line 27.

On the upper surface of the dielectric substrate 4, a control voltage supply line 13 to the variable reactance element 12 is formed, and stubs 13' are formed at fixed locations along the control voltage supply line 13.

Furthermore, in FIGS. 1A and 1B, a dielectric stripline 5 is shown. Grooves having a width as wide as the dielectric stripline 5 are formed at fixed locations in the upper and lower conductor plates 1 and 2, and the dielectric stripline 5 is disposed along the grooves. By using the dielectric stripline 5 and the upper and lower conductor plates 1 and 2, a nonradiative dielectric line (hereinafter, called an "NRD guide") is constructed. Particularly, in this example, the distance between the upper and lower conductor plates in the space on both sides of the dielectric stripline 5 is made narrower than the distance between the upper and lower conductor plates in the portion of the dielectric stripline 5, and accordingly the nonradiative dielectric line functions so that the propagation of an LSE01 mode is prevented and an LSM mode of a single mode is propagated.

On the dielectric substrate 3, the line 7 provided on the upper surface of the substrate 3 is disposed so as to be perpendicular to the axial direction of the dielectric stripline 5 and parallel to the upper and lower conductor plates, and the dielectric stripline 5 is positioned between the connecting location of the Gunn diode 6 and the coupling location of the dielectric resonator 16. Because of this, a mode of a suspended line formed by the line 7 and the upper and lower conductor plates and an LSM01 mode of the above dielectric line are magnetically coupled.

Figure 2:
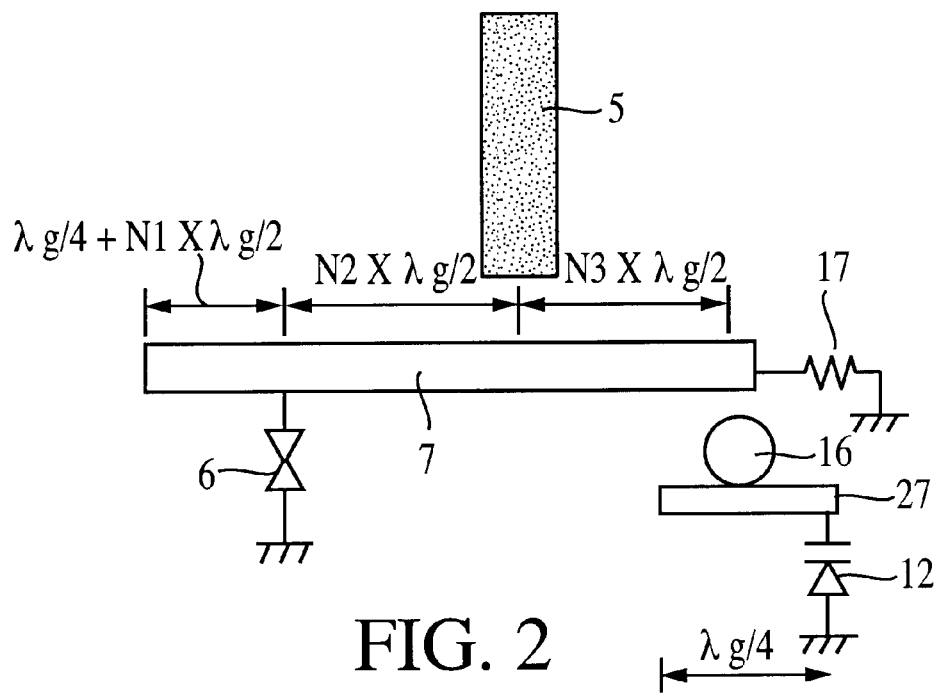
FIG. 2 shows the relationship between a line in a oscillation circuit and the connecting location of a Gunn diode, etc., in the oscillator in FIGS. 1A, 1B, and 1C.

FIG. 2 is a schematic diagram showing the construction of the portion of the oscillation circuit shown in FIG. 1. One end of the line 7 is terminated with a terminating resistor 17 and the other end is made open. When the wavelength of a signal to be carried on the line 7 is denoted by $\lambda_g$, and since the impedance of the Gunn diode 6 is as low as a few ohms (Ω) in this example, impedance matching is accomplished by connecting the Gunn diode 6 at a location which is $\lambda_g/4+N_1\times\lambda_g/2$ from the open end of the line 7, that is, a point which is substantially short-circuited in an equivalent circuit of the line.

The variable reactance element 12 is connected to a location which is approximately $\lambda_g/4$ from the open end of the secondary line 27. Then, the dielectric resonator 16 is coupled to fixed locations along the line 7 and the secondary line 27, respectively. The dielectric resonator 16 is made up of a columnar-shaped dielectric material and is used as a TE01δ mode resonator.

The dielectric stripline 5 of the NRD guide is disposed close to a location along the line 7 which is $N_2\times\lambda_g/2$ from the connecting location of the Gunn diode 6 and which is $N_3\times\lambda g/2$ from the coupling location of the dielectric resonator 16, that is, to a substantially short-circuited point in an equivalent circuit of the line 7. Because of this, the line 7 is magnetically coupled to the NRD guide at a location where the magnetic field of the line is high, and accordingly a TEM mode of the line 7 is converted into an LSM01 mode with a high coupling coefficient.

Based on the above construction, an oscillation signal is transmitted through the NRD guide.

Furthermore, stubs 8' shown in FIG. 1A are provided at locations which are multiples of about one fourth of the wavelength on the bias line away from the location where the Gunn diode is connected, that is, from the location of a substantially short-circuited point in an equivalent circuit of the bias line. Therefore, the impedance Z when looking toward the bias power supply from the side of the Gunn diode 6 is a high impedance, and the stubs 8' function as a trap. Because of this, the oscillation signal does not leak to the side of the bias power supply through the bias line, and the modulation characteristics and oscillation efficiency are improved. In the same way, stubs 13' shown in FIG. 1A are provided at locations which are multiples of one fourth of the wavelength away from a substantially short-circuited point in an equivalent circuit of the secondary line 27. Therefore, the oscillation signal does not leak to the side of the control voltage supply line 13, and the modulation characteristics and oscillation efficiency are improved.

Figure 3:
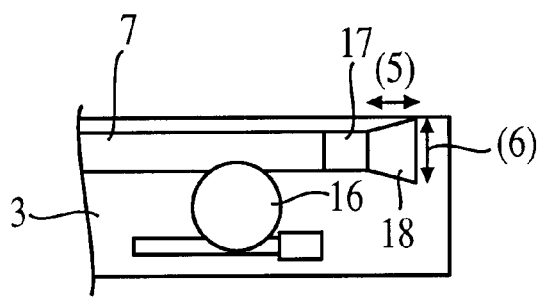
FIG. 3 shows the construction of part of the line in an oscillation circuit in the oscillator in FIGS. 1A, 1B, and 1C.

FIG. 3 shows the construction of the vicinity of the terminated end of the line 7 shown in FIG. 1A. At the end portion of the line 7, a pattern for a terminating resistor 17 is formed and a stub 18 is formed at the end of the terminating resistor 17. The length (5) of the stub 18, from the connecting location to the terminating resistor 17 to the end of the stub 18, and the width (6) at the end of the stub 18 are each made substantially one fourth of the wavelength on the line, respectively.

In this way, the dielectric resonator is made not to couple to the dielectric stripline in the NRD guide, but to couple to the stripline in the oscillation circuit. Thus, it is not required to secure a space for mounting a dielectric resonator in the cutoff area of the NRD guide, and accordingly the oscillator can be made smaller in total. Furthermore, symmetry is maintained in the left and right directions in the portion where the NRD guide is coupled to the line 7, so that unwanted modes are not caused. Moreover, as the dielectric substrate constituting the oscillation circuit can be disposed so as to be parallel with the conductor plates of the NRD guide, that is, as it is not required to dispose the line of the resonance circuit and the NRD guide in a three-dimensional way, the degree of coupling to the NRD guide is not changed by the length of the line 7 and the location of its open end, and accordingly the NRD guide and the dielectric resonator can be made to couple with the most appropriate phase relationship.

Next, the construction of an oscillator according to a second embodiment is described with reference to FIGS. 4A, 4B, and 4C. In the first embodiment, a TE01δ mode resonator of a columnar dielectric material was used, but in the second embodiment, a resonator is constructed in a dielectric substrate.

Figure 4A:
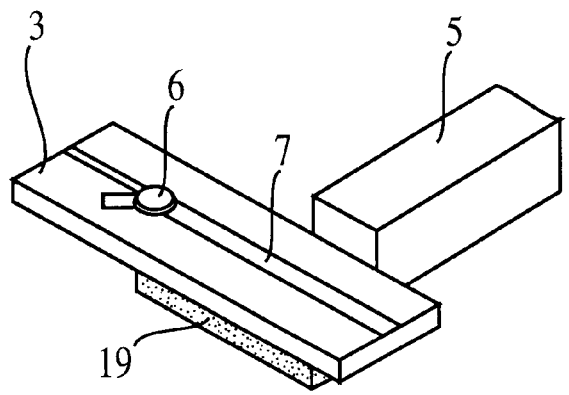
FIGS. 4A, 4B, and 4C show the construction of an oscillator according to a second embodiment.
Figure 4B:
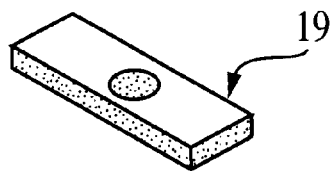
Figure 4C:
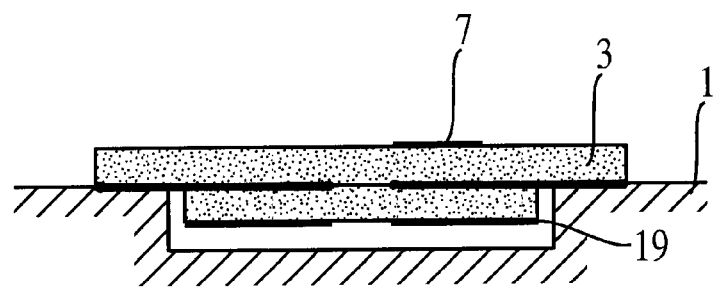

FIG. 4A is a perspective view of the main part of the resonator, FIG. 4B is a perspective view of the main part of its resonance substrate, and FIG. 4C is a sectional view of the main part of the resonator. As shown in FIG. 4A, a resonance substrate 19 is laminated on the lower surface of a dielectric substrate 3 constituting an oscillation circuit. In the resonance substrate 19 as shown in FIG. 4B, electrodes having circular electrodeless portions facing each other are provided on both sides of the dielectric substrate. The area of the dielectric substrate sandwiched between the electrodeless portions of the electrodes functions as a dielectric resonator of a TE10 mode. As shown in FIG. 4C, by disposing the electrodeless portion of the resonance substrate 19 in the vicinity of the line 7, the above resonator is made to couple to the line 7.

In other respects, the construction of the oscillation circuit to the dielectric substrate 3, and the structure of the coupling portion of the line 7 to the NRD guide including a dielectric stripline 5 are the same as in the case of the first embodiment.

Next, the construction of an oscillator according to a third embodiment is described with reference to FIGS. 5 and 6. The construction of the oscillator in the third embodiment is basically the same as that shown in the first embodiment, but the oscillator is arranged to provide a harmonic of a fundamental frequency of the oscillator.

Figure 5:
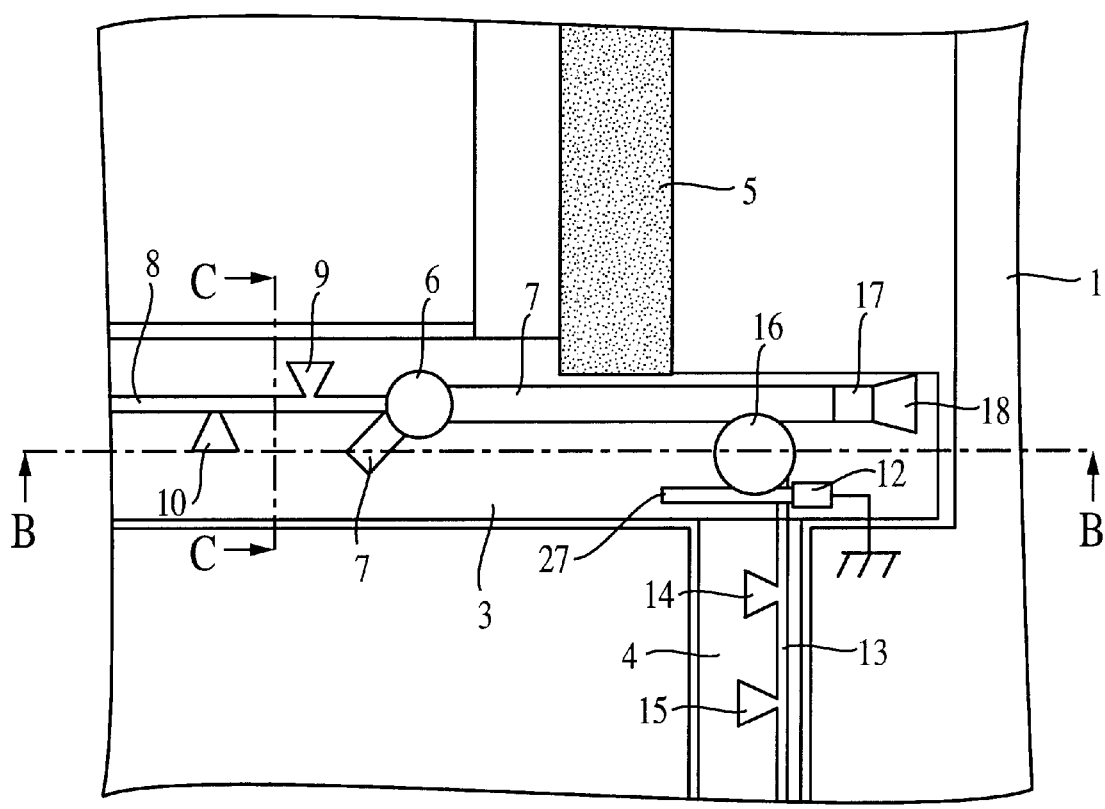
FIG. 5 shows the construction of an oscillator according to a third embodiment.
Figure 6:
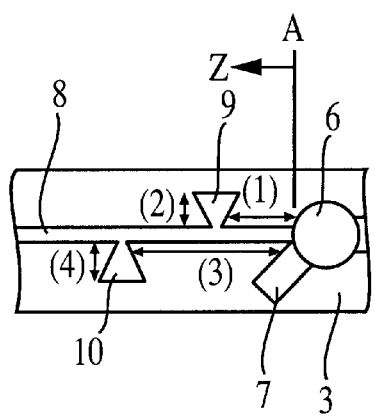
FIG. 6 shows the construction of a bias line in the oscillator in FIG. 5.

FIG. 5 is a top view of an oscillator having upper and lower conductor plates in which the upper conductor is removed. Unlike the oscillator shown in FIGS. 1A, 1B, and 1C, in the third embodiment, the cutoff frequency of an NRD guide made up of a dielectric stripline 5 and upper and lower conductor plates 1 and 2 is determined so that the fundamental wave component of an oscillation signal from an oscillation circuit is cut off and the component of the second harmonic or higher harmonic is transmitted. When 38 GHz, for example, is the fundamental oscillation frequency of a Gunn diode 6, 76 GHz as its second harmonic is transmitted to the NRD guide.

Unlike the case of the first embodiment shown in FIG. 1A, a stub 9 for harmonics and a stub 10 for the fundamental wave are provided in a bias line 8. FIG. 6 shows the construction of that portion. The stub 9 is provided at a location a distance (1) apart from the location of the Guun diode 6, and the length of the stub 9 from the connecting point to the bias line 8 to the open end of the stub 9 is made a distance (2). Furthermore, the stub 10 is provided at a location a distance (3) apart from the location of the Gunn diode 6, and the length of the stub 10, from the connecting point to the bias line 8, to the open end of the stub 10, is made a distance (4). The above distance (1) is made substantially one fourth of the wavelength of the second harmonic on the bias line from the connecting location of the Gunn diode, that is, the location of a substantially short-circuited point in the equivalent circuit. The distance (2) is substantially one fourth of the wavelength of the second harmonic. Moreover, the above-mentioned distance (3) is made substantially one fourth of the wavelength of the fundamental wave on the bias line from the connecting location of the Gunn diode, that is, the location of a substantially short-circuited point in the equivalent circuit. The distance (4) is substantially one fourth of the wavelength of the fundamental wave. However, the length (3) from the above-mentioned short-circuited point to the grounding location of the stub 10 is determined in consideration of the influence of the stub 9 (the above-mentioned lengths (1) and (2)).

Therefore, the impedance Z looking toward the bias power supply from A is a high impedance (ideally a point of infinite impedance on the Smith chart) at the frequencies of the fundamental wave and the second harmonic, the stub 9 functions as a trap for a component of the second harmonic, and the stub 10 operates as a trap for a component of the fundamental wave. Because of this, an oscillation signal does not leak to the side of the bias power supply through the bias line, and the modulation characteristics and oscillation efficiency are improved.

The same stubs as the above-mentioned stubs are also provided in a control voltage supply line 13 as shown in FIG. 5. A stub 14 is connected to a location one fourth of the wavelength of the second harmonic apart from an equivalently short-circuited point of a stub 11 for a variable reactance element, and the length from the connecting point to the open end of the stub 14 is made one fourth of the wavelength of the second harmonic. Furthermore, a stub 15 is connected to a location one fourth of the wavelength of the fundamental wave apart from the equivalently short-circuited point of the stub 11 for a variable reactance element, and the length from the connecting location to the open end of the stub 15 is made one fourth of the wavelength of the fundamental wave. Therefore, an oscillation signal does not leak to the side of the control voltage supply line 13, and the modulation characteristics and oscillation efficiency are improved.

Figure 7:
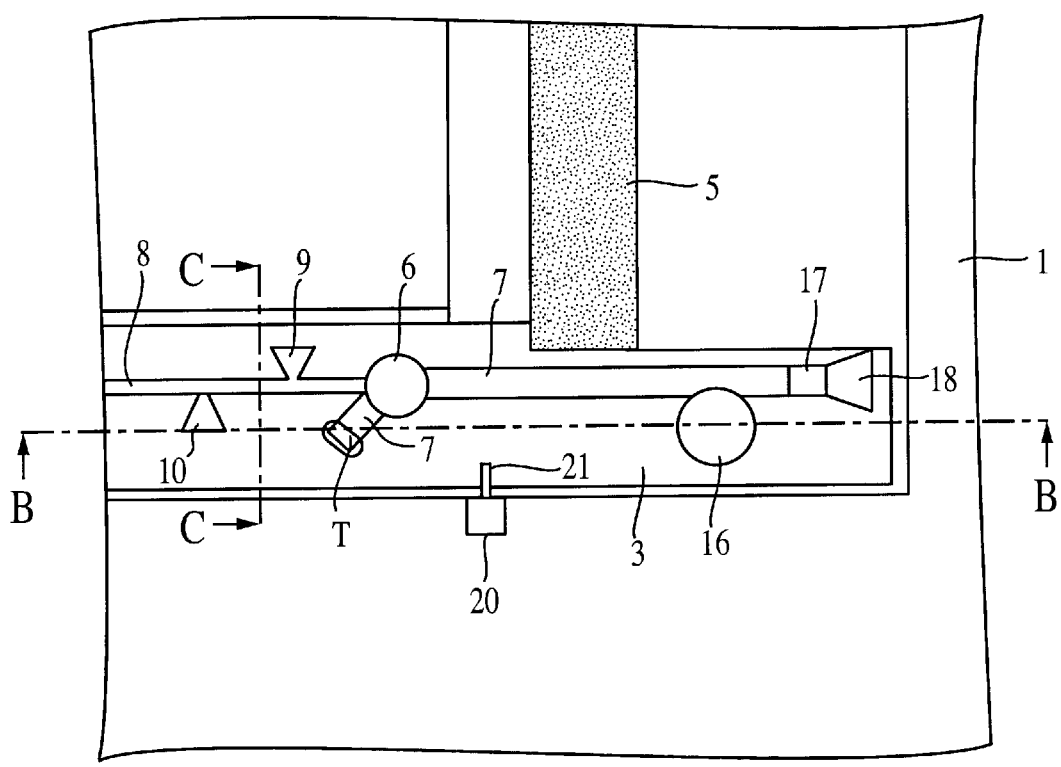
FIG. 7 shows the construction of an oscillator according to a fourth embodiment.

Next, the construction of an oscillator according to a fourth embodiment is shown in FIG. 7. FIG. 7 is a top view of the oscillator in which an upper conductor plate is removed. Unlike the example shown in FIG. 1, on the dielectric substrate 3, an electrode 21 and an adjustment terminal 20 are provided. Furthermore, in this example, no voltage-controlled variable frequency circuit is provided.

In FIG. 7, by weakly coupling the electrode 21 to the line 7 and by connecting a spectrum analyzer, etc. to the adjustment terminal 20, it is possible to monitor an oscillation signal. In order to adjust the oscillation frequency, for example, the portion T of one open end of the line 7 is trimmed so that the frequency of the fundamental wave becomes half of the frequency of the second harmonic which is actually used.

In this way, as the electrode 21 is only weakly coupled to the line 7, the electrode 21 does not adversely affect anything else. Furthermore, because the electrode 21 is weakly coupled to the line 7 where the fundamental wave component is not cut off and the electrode 21 monitors the oscillation signal, the frequency of the fundamental wave which is lower than an oscillation frequency to be output to an NRD guide can be measured, and the use of a low cost spectrum analyzer becomes possible.

Moreover, the oscillation frequency may be stabilized by making the oscillation frequency voltage-controllable, as shown in the first embodiment, by providing a variable reactance element, by detecting the oscillation frequency of a signal taken out by the above adjustment terminal, and by feeding back the control voltage so as to give a required frequency.

Figure 8:
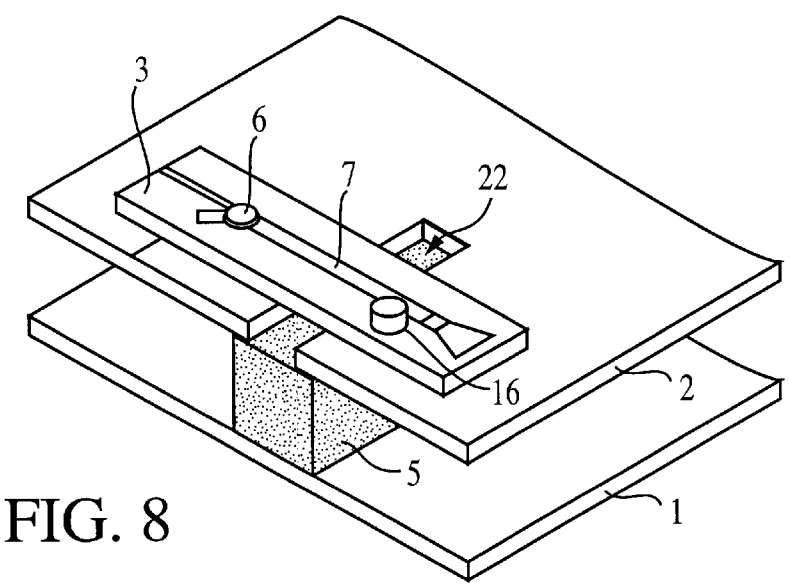
FIG. 8 is a perspective view showing the construction of an oscillator according to a fifth embodiment.

Next, the construction of an oscillator according to a fifth embodiment is described with reference to FIG. 8.

In the first to fourth embodiments, a dielectric substrate 3 was provided within a space sandwiched between upper and lower conductor plates, but, in the fifth embodiment, a dielectric substrate 3 is disposed outside upper and lower conductor plates. That is, in the upper conductor plate 2, a slot 22 is formed in the length direction of a dielectric stripline 5, and the dielectric substrate 3 is disposed so that a line 7 for an oscillation circuit becomes perpendicular to the slot 22. The construction of the dielectric substrate 3 is basically the same as that shown in FIGS. 1A, 1B, and 1C or FIG. 5. However, a mode (that is, a TEM mode) of a microstrip line propagated on the line 7 of the oscillation circuit and an LSM mode of a dielectric line are magnetically coupled through the slot 22. With this arrangement, the magnetic field of the TEM mode spreads through the slot, but the magnetic field of the LSM mode hardly leaks to the side of the dielectric substrate 3 from the slot 22. Therefore, unidirectional coupling takes place from the line 7 to the NRD guide. When constructed in this way, even if the wave reflected at the discontinuity portion in the NRD guide returns to the side of the Gunn diode, the signal level is suppressed. Moreover, because the NRD guide does not propagate the fundamental wave component, the component is not included in the signal which returns to the side of the Gunn diode. Therefore, the wave reflected at the discontinuity portion in the NRD guide has only a slight influence on the oscillation characteristics.

Next, the construction of an oscillator according to a sixth embodiment is described with reference to FIGS. 9A and 9B.

Figure 9A:
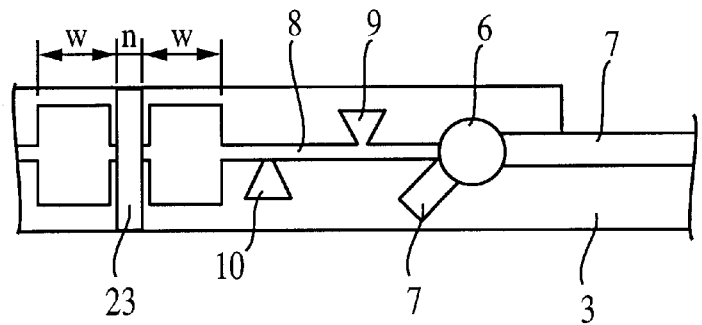
FIGS. 9A and 9B show the construction of an oscillator according to a sixth embodiment.
Figure 9B:
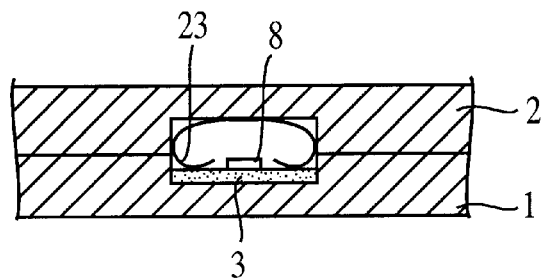

FIG. 9A is a top view of the portion of an oscillation circuit in which an upper conductor plate is removed, and FIG. 9B is a sectional view at a plane perpendicular to a bias line in which the upper conductor plate is provided. In this example, a bias line 8 is made to have the characteristics of a low-pass filter to cut off components of an oscillation signal by forming a repeating pattern of alternating wide and narrow portions in the bias line. Further, a pressure spring 23 is provided at one of the portions of narrow line width indicated by n. This pressure spring 23 is disposed so as to press a dielectric substrate 3 against a lower conductor plate 1 in a space between a dielectric substrate 3 and a upper conductor plate 2, when the dielectric substrate 3 is disposed inside the space defined between the upper and lower conductor plates 1 and 2. Therefore, even if the dielectric substrate 3 is slightly warped, the dielectric substrate 3 is securely fixed inside the space defined by the upper and lower conductor plates, and stable frequency characteristics can be obtained.

Moreover, because the pressure spring is provided in the portion of narrow width of the bias line, the pressure spring is not conductively connected to the bias line, and as this portion functions as an inductor equivalently, the portion has little influence on the bias line.

Next, as an embodiment of radio equipment according to the invention, an example of the construction of a milliwave radar is explained with reference to FIG. 10.

Figure 10:
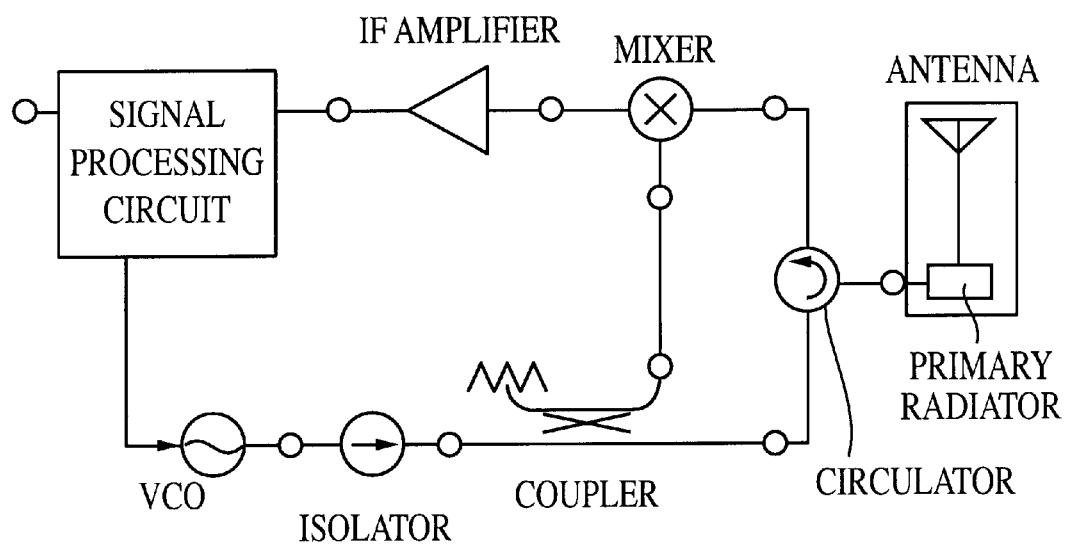
FIG. 10 is a block diagram showing the construction of a milliwave radar according to a seventh embodiment.

In FIG. 10, a VCO (voltage-controlled oscillator) is the oscillator shown in the first embodiment. In the VCO, an oscillation signal which is frequency modulated by a triangular wave signal, for example, from a signal processing circuit is output. The oscillation signal is transmitted to a primary radiator through an isolator, a coupler, and a circulator. In this way, a milliwave signal of a fixed beam width is transmitted by the primary radiator through a dielectric lens, etc. Part of the transmission signal is conducted by the coupler to a mixer for serving as a local signal. When a wave reflected from an object enters the primary radiator, the reception signal is given to the mixer through the circulator. The mixer mixes the reception signal from the circulator and the above-mentioned local signal to produce an intermediate-frequency signal. An IF amplifier amplifies this intermediate-frequency signal and gives the signal to the signal processing circuit. The signal processing circuit detects the distance to the object and the relative speed of the object based on the modulated signal given to the VCO and the IF signal.

Although Gunn diode of a pill package type was used in the embodiments, a surface mounting type Gunn diode may be mounted on the dielectric substrate. Furthermore, as the negative-resistance element, a three-terminal element such as a FET, etc., may be used instead of a Gunn diode. When a MOS-FET, for example, is used, a line for coupling to the NRD guide is connected to the drain, a resonance line is connected to the source, and a bias line is connected to the gate.

In the embodiment, the oscillator generates a second harmonic oscillation signal in the 76 GHz band. But, of course, another oscillation output frequency, for example a higher order harmonic, may be selected to be generated by the oscillator and transmitted to the output transmission line. As described above, the oscillation output frequency can be controlled by adjusting the cutoff frequency of the NRD guide.

Moreover, in the embodiment, the coupling between the lines was made by making the line 7 in the oscillation circuit on the dielectric substrate 3 close to the end portion of the dielectric stripline 5. However, coupling between the line in the oscillator circuit and the NRD guide may also be made by dividing the dielectric stripline into upper and lower parts by a plane which is parallel to the upper and lower conductor plates, and disposing the dielectric substrate between the upper and lower parts of the dielectric stripline.

According to an aspect of the present invention, as a dielectric resonator is mounted on a dielectric substrate constituting an oscillation circuit, room for disposing the dielectric resonator is not required in a space between upper and lower conductor plates which is a cutoff area of an NRD guide, and accordingly an overall smaller oscillator can be devised. Furthermore, positioning of the dielectric resonator becomes easy and it is easy to obtain an oscillator with required characteristics.

According to another aspect of the invention, coupling between a line made up of a conductor pattern and a dielectric line of an oscillation circuit becomes easy, and loss accompanying mode conversion can be reduced. Furthermore, in the coupling portion, the symmetry to the left and the right is maintained and unwanted electromagnetic filed modes are not generated.

According to another aspect of the invention, impedance matching of a line of an oscillation circuit to a negative-resistance element having low impedance can be easily achieved, and, moreover, the line of an oscillation circuit can be strongly coupled to a dielectric line, and accordingly by reducing loss accompanying mode conversion, an oscillator of high efficiency can be devised.

According to another aspect of the invention, the no-load Q is decreased little, even when a resonator made up of a resonance substrate is coupled to a line of an oscillation circuit. Thus, a reduction in phase noise is obtained.

According to another aspect of the invention, the oscillation frequency of an oscillator can be made variable by utilizing voltage control, whereby the oscillator can be a voltage-controlled oscillator.

According to another aspect of the invention, a high-frequency signal which is difficult to obtain directly from an oscillator can be easily obtained. Furthermore, because an oscillation circuit is constructed by using a dielectric substrate and an output transmission line containing a portion of dielectric material between two substantially parallel conductor surfaces is used, unlike the case in which a cavity wave guide is used, an oscillator which is small and easy in adjustment of resonance frequency, appropriate for mass-production, and of low cost can be devised. Moreover, because the fundamental wave component or lower-order harmonics are securely cut off in the output transmission line and only the component of harmonics to be used is transmitted, the signal of a harmonic to be utilized does not attenuate and accordingly loss is not caused.

According to another aspect of the invention, without adverse effect to an oscillation circuit, and because a signal of the frequency of the fundamental wave the frequency of which is lower than a frequency to be utilized, can be monitored, low cost instruments can be used.

According to another aspect of the invention, because a signal returning from a dielectric line to an oscillation circuit is suppressed and moreover a signal of the frequency of the fundamental wave does not return, stable oscillation characteristics can be obtained.

According to another aspect of the invention, variations in characteristics due to the deformation of a dielectric substrate is suppressed, and therefore stable characteristics can be obtained.

According to another aspect the invention, a milliwave radar, etc., which are small-sized in total and have low loss and high gain can be obtained.

While the invention has been particularly shown and described with reference to preferred embodiments, it will be understood by those skilled in the art that the foregoing and other changes in form and details can be made without departing from the spirit and scope of the invention.

What is claimed is:

1. An oscillator comprising an oscillation circuit constructed on a dielectric substrate, and an output transmission line which transmits an oscillation output signal from the oscillation circuit, wherein the oscillation circuit comprises a line made up of a conductor pattern disposed on the dielectric substrate, a negative-resistance element connected to the line, and a dielectric resonator disposed in the vicinity of the line on the dielectric substrate, the dielectric resonator being coupled to the line; and wherein the line is coupled to the output transmission line at a location between the connecting location of the negative-resistance element and the coupling location of the dielectric resonator along the line.

2. An oscillator as claimed in claim 1, wherein the output transmission line is made up of a dielectric stripline disposed between two substantially parallel conductor plates.

3. An oscillator as claimed in claim 2, wherein a slot is formed in one conductor plate of said two substantially parallel conductor plates, wherein the dielectric substrate is disposed outside the conductor plate, and wherein a line of the oscillation circuit and the dielectric line are coupled.

4. An oscillator as claimed in claim 1, wherein, when the wavelength of a signal to be carried on the line is denoted by $\lambda_g$, the length from the connecting location of the negative-resistance element to an end portion in the vicinity of the line is substantially $\lambda_g/4 + N_1 \times \lambda_g/2$, the length from the connecting location of the negative-resistance element to the coupling location of the output transmission line is substantially $N_2 \times \lambda_g/2$, and the length from the coupling location of the output transmission line to the coupling location of the dielectric resonator is substantially $N_3 \times \lambda_g/2$ (wherein $N_1$, $N_2$ and $N_3$ are integers greater than zero).

5. An oscillator as claimed in claim 1, wherein the dielectric resonator is constructed by providing electrodes having respective opposed opening portions on a second dielectric substrate with which the first-mentioned dielectric substrate is laminated.

6. An oscillator as claimed in claim 1, further comprising a secondary line provided on the dielectric substrate and coupled to the dielectric resonator, a variable reactance element connected to the secondary line, and a line for supplying control voltage connected to the variable reactance element.

7. An oscillator as claimed in claim 6, wherein the dielectric substrate is housed inside a case, wherein a portion of wide line width and a portion of narrow line width are provided in the control voltage line, and in the vicinity of the portion of narrow line width a spring is provided for fixing the dielectric substrate with respect to the inner surface of the case.

8. An oscillator as claimed in claim 1, wherein the output transmission line is made up of a transmission line in which a portion of dielectric material is contained between two substantially parallel conductor surfaces and has a cutoff frequency, and the cutoff frequency of the transmission line is determined so that the fundamental wave component, or the fundamental wave component and lower-order harmonics, are cut off, and a harmonic of higher order than the cut-off components is transmitted.

9. An oscillator as claimed claim 1, further comprising a terminal which is weakly coupled to the line of the oscillation circuit.

10. Radio equipment comprising at least one of a transmission circuit and a reception circuit, said circuit comprising an oscillator, wherein said oscillator comprises a line made up of a conductor pattern disposed on the dielectric substrate, a negative-resistance element connected to the line, and a dielectric resonator disposed in the vicinity of the line on the dielectric substrate, the dielectric resonator being coupled to the line; and wherein the line is coupled to the output transmission line at a location between the connecting location of the negative-resistance element and the coupling location of the dielectric resonator along the line.

* * * * *